United States Patent
Belenky et al.

(10) Patent No.: US 9,065,000 B2
(45) Date of Patent: Jun. 23, 2015

(54) COMPOUND SEMICONDUCTOR DEVICE ON VIRTUAL SUBSTRATE

(76) Inventors: Gregory Belenky, Port Jefferson, NY (US); Leon Shterengas, Coram, NY (US); Arthur David Westerfeld, Central Islip, NY (US)

(*) Notice: Subject to any disclaimer, the term of this patent is extended or adjusted under 35 U.S.C. 154(b) by 795 days.

(21) Appl. No.: 13/038,585

(22) Filed: Mar. 2, 2011

(65) Prior Publication Data

US 2012/0223362 A1    Sep. 6, 2012

(51) Int. Cl.
*H01L 31/0336* (2006.01)
*H01L 31/0687* (2012.01)

(52) U.S. Cl.
CPC ......... *H01L 31/06875* (2013.01); *Y02E 10/544* (2013.01)

(58) Field of Classification Search
CPC .................................................. H01L 31/06875
USPC .................................. 257/183–184, 190–191
See application file for complete search history.

(56) References Cited

U.S. PATENT DOCUMENTS

| | | | |
|---|---|---|---|
| 4,184,171 A | 1/1980 | Panish | |
| 4,195,305 A | 3/1980 | Moon | |
| 4,833,101 A | 5/1989 | Fujii | |
| 5,633,516 A | 5/1997 | Mishima et al. | |
| 5,770,868 A | 6/1998 | Gill et al. | |
| 6,713,326 B2 | 3/2004 | Cheng et al. | |
| 7,053,293 B2 | 5/2006 | Uppal | |
| 7,633,083 B2 | 12/2009 | Lester et al. | |
| 7,737,411 B2 | 6/2010 | Gunapala et al. | |
| 2003/0185265 A1* | 10/2003 | Henrichs | 372/96 |
| 2004/0028109 A1* | 2/2004 | Rice et al. | 372/74 |
| 2005/0072460 A1* | 4/2005 | Uppal | 136/253 |
| 2006/0056466 A1* | 3/2006 | Belenky et al. | 372/20 |
| 2009/0127462 A1* | 5/2009 | Gunapala et al. | 250/338.4 |

OTHER PUBLICATIONS

F. Gao, N. F. Chen, X. W. Zhang, Y. Wang, L. Liu, Z. Yin, and J. Wu, "Structural, electrical, and optical properties of $InAs_xSb_{1-x}$ epitaxial films grown by liquid-phase epitaxy", Journal of Applied Physics, vol. 104, 2008, p. 073712.

* cited by examiner

*Primary Examiner* — Samuel Gebremariam (57) ABSTRACT

A method of fabrication of barrier diode based infrared detectors, utilizing the growth of unstrained, not relaxed III-V compound semiconductor material layers having a lattice constant over 6 Angstrom, is provided. The growth is performed by the means of Molecular Beam Epitaxy (MBE) or Metal-Organic Vapor Phase Epitaxy (MOVPE). The method comprises the use of bulk crystalline substrates and the growth of a transitional layer of GaInAsSb with graded composition, followed by an optional thick layer of GaInAsSb of constant composition, lattice matched to the said III-V compound semiconductor material layers, the said optional layer of GaInAsSb of constant composition serving as a virtual substrate. The method provides high crystalline quality layers suitable for semiconductor device fabrication that can effectively interact with electromagnetic radiation of the mid-infrared spectral range with a wavelength between about 2 micrometers to about 16 micrometers.

10 Claims, 6 Drawing Sheets

COMPOUND SEMICONDUCTOR DEVICE ON VIRTUAL SUBSTRATE

CROSS-REFERENCE TO RELATED APPLICATION

Not Applicable

FEDERALLY SPONSORED RESEARCH

Not Applicable

SEQUENCE LISTING OR PROGRAM

Not Applicable

FIELD OF THE DISCLOSURE

Aspects of the invention relate generally to solid state detectors of electromagnetic radiation in the mid-infrared spectral range, and more particularly, to semiconductor devices fabricated from compound alloys comprising the elements of Group III and Group V of the Periodic System of Elements by means of Molecular Beam Epitaxy and Metal-Organic Vapor Phase Epitaxy.

BACKGROUND OF THE DISCLOSURE

Solid state electronic devices efficiently interacting with the electromagnetic radiation of various spectral ranges are the basis of state-of-the-art communications, space and other emerging technologies. This rapidly growing market became available due to the effects of electron-hole pair generation and recombination in the semiconductor materials. The most practical material system for these optoelectronic applications is the variety of alloys comprising Group III elements (Boron, Aluminum, Gallium, Indium) and Group V elements (Nitrogen, Arsenic, Antimony) of the Periodic System. This material system provides semiconductor materials with band gaps ranging from about 80 meV to over 6 eV, thus covering spectral ranges from mid-infrared (mid-IR) to deep ultraviolet (deep UV), or the wavelength ranges from about 16 micrometers to 200 nanometers.

The two major requirements for the compound semiconductor technology are extremely low defect density and precise control over the alloy composition. This last requirement means basically that the material for this technology must be prepared artificially, using one or more of the methods of crystal growth available to the skilled artisan. The choice of the growth method directly affects the material quality; in another words, the defect density, purity and compositional uniformity.

Currently, the most conventional crystal growth method used for the compound semiconductor material is Epitaxy. In this method, the material is assembled from atoms provided by atomic sources which are then deposited at the surface of a bulk crystal, which is called the Substrate. The different types of Epitaxy are distinguished by the atomic sources types. The said sources can be liquid or gaseous by phase, and atomic to chemical compounds by composition. Accordingly, there exist Liquid Phase Epitaxy (LPE), Molecular Beam Epitaxy (MBE) and Vapor Phase Epitaxy (VPE). Among the Vapor Phase Epitaxy, the best results for the compound semiconductor growth are reported using Metal-Organic Vapor Phase Epitaxy, where the elements of the Group III are supplied by gaseous metalorganic compounds, such as trimethyl-metals, triethyl-metals, or the like. Each method has its advantages and limitations related to the particular material composition to be grown.

In each epitaxial growth method, the resultant material quality depends strongly on the substrate used. In addition to the substrate crystal quality, the important parameter affecting the result is the lattice mismatch between the substrate and the epitaxially deposited film. Large mismatch leads to the mechanical strain in the epitaxial film, which in turn is relaxed through the development of structural defects as the film thickness increases. To create a high quality bulk layer, it is necessary to reduce the lattice mismatch between the epitaxial film and the substrate for each particular film composition.

The substrate for the epitaxial film deposition must be a bulk crystal that is able to provide proper mechanical support. Bulk crystals are typically obtained by methods other than epitaxial deposition and are in most cases limited to binary compounds of the Group III and Group V elements. Thus, only discrete values for the substrate lattice constants are available for compound semiconductor epitaxial growth. Several methods were developed in the past to overcome this limitation. These methods are summarized in the Prior Art section of this disclosure.

While nearly all compound semiconductors suffer from the absence of native or lattice matched substrates, the situation is probably most critical in the narrow band gap compounds, such as antimonides or arsenic-antimonides. Gallium Antimonide GaSb, Indium Antimonide InSb and their ternary and quaternary (with addition of Arsenic) compounds have the largest lattice constant of the III-V compounds, and offer exclusively narrow band gaps of 0.08 to 0.6 eV, which corresponds to an electromagnetic radiation wavelength of 2 to 16 micrometers. This spectral range is extremely important for a variety of applications including, but not limited to, radar, communications, and space monitoring. However, for effective interaction with electromagnetic radiation of this spectral range, and especially for the effective absorption of radiation in detection and photovoltaic applications, layers of the material with thicknesses in micrometer scale (depending on the absorption coefficient) are needed. These thicknesses are well above the critical thickness for strain relaxation in the strained crystalline film, so that epitaxial growth of these compounds on the lattice mismatched substrate results in high defect density developed due to the said strain relaxation.

It is therefore desirable to develop the method of growth and fabrication of infrared photodetectors comprising III-V alloys with high Antimony compositions of high quality and appropriate thickness.

PRIOR ART

The idea of using III-V compounds for coupling electronic components with micrometer wavelength range radiation can be illustrated, for example, by U.S. Pat. No. 4,184,171 by Morton Panish. Once the bandgap of a semiconductor material is equal or (slightly) less than the energy of a photon of incoming electromagnetic radiation, the said radiation can effectively be absorbed by the said semiconductor material, creating an electron-hole pair in the conducting and valence band of the said semiconductor material, for each photon absorbed. The created electron and hole can either recombine back (with or without emission of a photon, or another words, with or without photoluminescence), or they can contribute to the net electric current through the material. In order to minimize the possibility of recombination of the created carriers, in effective photodetectors they are separated from each other in space by creating an electric field across a portion of the semiconductor material.

Photodetection can be achieved in p-n diode structures, as well as p-i-n diodes, metal-semiconductor-metal (MSM) diodes, phototransistors and such. All these structures take advantage of a low doping level in the light absorption region, allowing for relatively thick depletion layers. Unfortunately, most of the compound semiconductors have high unintentional doping level, making depletion-based photodetection a challenging task.

Recently, a new class of the photodetectors was proposed, namely, barrier diodes. They can have so-called nBn or pBp structure, depending on whether they comprise a quantum barrier layer that blocks the transport of electrons (nBn) or holes (pBp). Both nBn and pBp barrier diodes are photodetecting devices with suppressed noise level. Additional information about their operation can be obtained, for example, from the disclosure of the U.S. Pat. No. 7,737,411 by Sarath Gunapala et al. However, the performance of these devices is currently limited by the absence of lattice-matched substrates that would allow fabrication of not strained and not relaxed light absorption layers of the thickness in micrometer scale (from about 0.1 micrometer to tens of micrometers).

In previously mentioned U.S. Pat. No. 4,184,171 by Panish, the heterostructures comprising the quantum wells and barriers are disclosed, having their lattice constants matched to each other to avoid strain and related defects in the structure. Aluminum Antimonide AlSb and Gallium Antimonide GaSb bulk crystals are provided as available substrates, thus limiting the active region to a very narrow range of compositions. It is additionally suggested that since Aluminum Antimonide allows longer wavelengths but also is hard to handle due to oxidation issues, the substrate can be graded towards its surface, by changing the Al content, from GaSb to AlSb. The technical details for such grading are not disclosed and are most probably not available to the Inventor by the time of the Invention.

Another example of the III-V heterostructure lattice matched to the substrate is disclosed in U.S. Pat. No. 4,833,101 by Toshio Fujii. Using bulk Indium Phosphide (InP) as a substrate, the lattice-matched compounds if AlGaAs and GaInAs are grown by MBE.

Practical techniques to accommodate the lattice mismatch and related stress in grown films were first demonstrated by LPE on bulk GaAs substrates. For example, in U.S. Pat. No. 4,195,305 by Ronald Moon, an AlGaAsSb layer with graded Al composition is grown that matches the GaAs lattice constant in the vicinity of the substrate, with the Al fraction diminishing in the direction of the epitaxial film growth towards the desired GaAsSb composition that couples effectively with the solar spectrum for efficient photovoltaic applications. Yet another approach of composition grading is demonstrated in U.S. Pat. No. 5,770,868 by David Gill and Parvez Uppal and U.S. Pat. No. 7,053,293 by Parvez Uppal by changing the Arsenic to Antimony ratio while performing AlGaAsSb film growth with a fixed Aluminum to Gallium ~0.5:0.5 compositional ratio on bulk GaAs substrate.

However, moving towards the infrared spectral range required compounds rich in both Indium and Antimony. While grown on GaAs substrates, such materials require larger lattice mismatch accommodations that cannot be achieved by monotonic composition grading due to the accumulated stress relaxation through structural defect development in the grown films. An advanced approach of alternating stressed and relaxed layers was developed from a similar technique, which is applied to the elementary Si—Ge alloys (see, for example, U.S. Pat. No. 6,713,326 by Zhi-Yuan Cheng et al.). Tomoyoshi Mishima et al. in U.S. Pat. No. 5,633,516 describes the use of alternating graded and holding layers for the growth of AlGaAs/GaInAs laterally conducting heterostructures on GaAs substrates. Finally, Luke Lester et al. in U.S. Pat. No. 7,633,083 disclose a similar approach of alternate grading and holding of the Al composition in AlInSb layers grown on GaAs substrate.

This last example allows, in general, reaching lattice constants up to 6.35 Angstroms, which corresponds to the bangap minimum of the InAsSb ternary alloys. However, it has several crucial disadvantages. First of all, the method of U.S. Pat. No. 7,633,083 is extremely complicated, as it requires precisely controlled growth of variable compounds comprising the transitional layer, of total thicknesses up to 10 micrometers, which is hard to achieve technologically. Second, it ultimately requires high and variable Al compositions in the transitional layer. The presence of Al substantially increases the effective masses of the carriers, thus reducing the carrier mobilities.

Another recent work by Fubao Gao et al. (Fubao Gao, Nuo Fu Chen, X. W. Zhang, Yu Wang, Lei Liu, Zhigang Yin, and Jinliang Wu, Structural, electrical, and optical properties of InAsxSb1-x epitaxial films grown by liquid-phase epitaxy", Journal of Applied Physics, 104, 073712_2008) provides the layers with the desired narrow band gap without Al contamination, on GaSb substrates. The cited work employs Liquid Phase Epitaxy of the InAsSb buffer lattice matched to the GaSb substrate, followed by lattice-mismatched, strained film growth of higher Antimony content limited in thickness to a certain critical value to prevent stress relaxation through misfit dislocations development.

It is, therefore, desirable to develop the method of fabrication of novel barrier diode based photodetectors, based on obtaining substrates, with or without transitional layers, suitable for the lattice matched growth of layers of III-V compound semiconductors with thickness in micrometer range (from about 0.1 micrometer to tens of micrometers) comprising Ga, In, As and Sb having a band gap in the range of 0.6 eV and below, for the applications of electromagnetic radiation detection in the spectral range from 2 to about 16 micrometers, where several local atmospheric transparency maxima are located, for a number of emerging applications.

SUMMARY OF THE INVENTION

Aspects of the invention are directed to a compound semiconductor device growth and fabrication technique by either MBE or MOVPE, said compound semiconductors being the III-V alloys comprising In and/or Ga, and As and/or Sb.

An objective of the present invention is to provide a substrate lattice-matched to a pre-selected III-V compound, preferably having a band gap of 0.6 eV or less, and to fabricate a barrier diode over the said substrate.

According to the present invention this can be achieved by selecting the bulk binary substrate from the group of GaSb and InSb, as well as any other suitable crystalline substrate such as, but not limited to, bulk compound, elementary or composite semiconductor, metal or dielectric, and applying either the MBE or the MOVPE growth method to its surface, growing the GaInAsSb layer with graded composition ratio of Ga to In and/or a graded composition ratio of As to Sb, until a lattice mismatch of less than 0.2% to a pre-selected III-V compound is reached, after which continue the epitaxial growth of the GaInAsSb layer of constant composition having the lattice mismatch of less than 0.2% to a pre-selected III-V compound, thus forming a relatively thick virtual substrate lattice matched to the desired barrier diode structure.

In a first aspect of the present invention, the bulk crystalline substrate having arbitrary lattice constant is obtained for the fabrication of the device comprising non-strained, not relaxed layer of the lattice constant between about 6.1 and 6.5 Angstrom, followed by MBE or MOVPE growth over the said substrate of a transitional layer of AlInGaAsSb material with the composition graded from that matching the lattice constant of the substrate to that providing lattice match with the said non-strained, not relaxed layer of the lattice constant between about 6.1 and 6.5 Angstrom.

In a second aspect of the invention, the said AlGaInSb transitional layer growth is continued with fixed composition, concluding the said transitional layer and forming a pseudo-bulk virtual substrate lattice matched to the said non-strained, not relaxed layer of the lattice constant between about 6.1 and 6.5 Angstrom.

In a third aspect of the invention, the said pre-selected device structure can be the structure suitable for fabrication of light detecting device such as a Barrier Diode having n-B-n or p-B-p structure, or an array of Barrier Diodes.

In a fourth aspect of the present invention, an opportunity is provided to the skilled device designer to select, given the desired cut-off wavelength, the active region structure including the conduction band and valence band discontinuities signs and ratios, by adjusting the As to Sb composition ratio in the said active region.

BRIEF DESCRIPTION OF THE DRAWINGS

These and other features of the present invention will be more readily understood from the following brief description of the various aspects of the invention and example described below, taken in conjunction with the accompanying drawings.

It is noted that some of the drawings of the invention are not to scale. The drawings are intended to depict only typical aspects of the invention, and therefore should not be considered as limiting the scope of the invention.

DETAILED DESCRIPTION OF THE INVENTION

Figure 1:
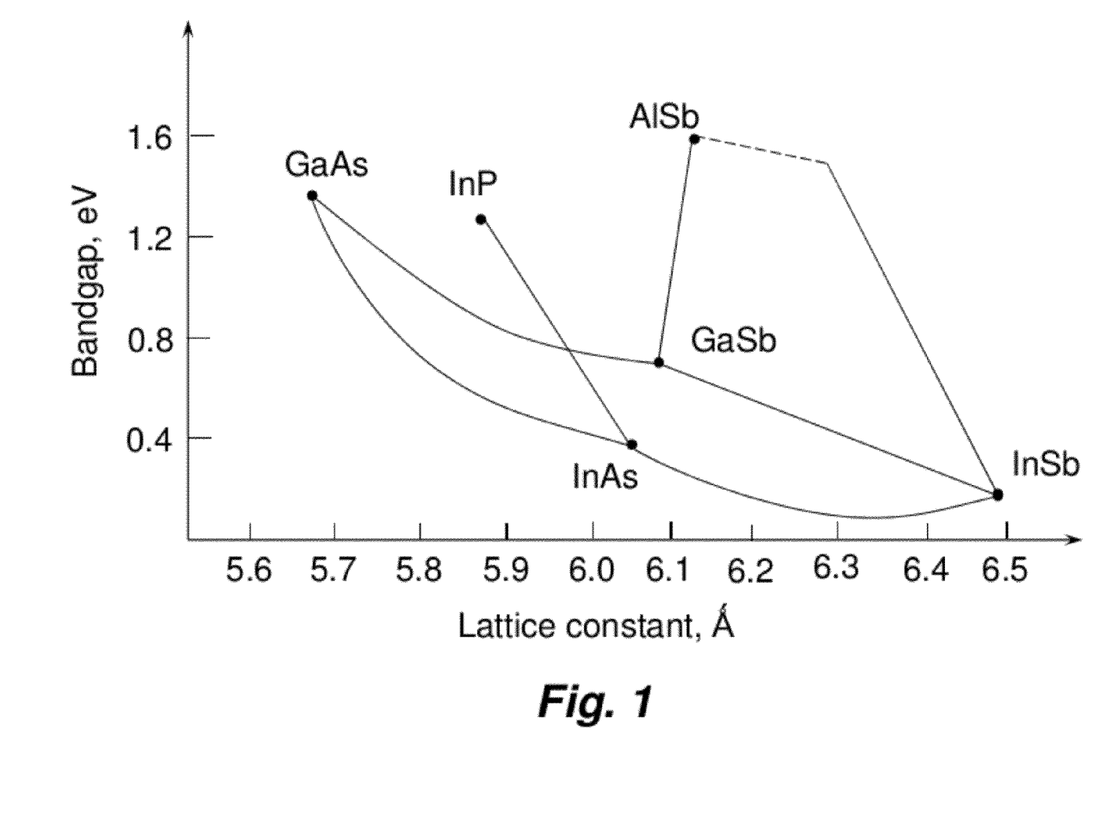
FIG. 1 provides the diagram illustrating the bandgap of some of III-V compounds and their respective lattice constants.

FIG. 1 presents the diagram showing the bandgaps of the narrow-band III-V compounds and their respective lattice constants. The lowest possible bandgap and largest associated wavelength are achieved for the compounds with the lattice constants around 6.3 Angstrom, which has no matching binary point. At the same time, the use of GaAs as a substrate, as in the Prior Art, is definitely not optimal due to much larger lattice mismatch than, for example, for GaSb and InSb.

Figure 2:
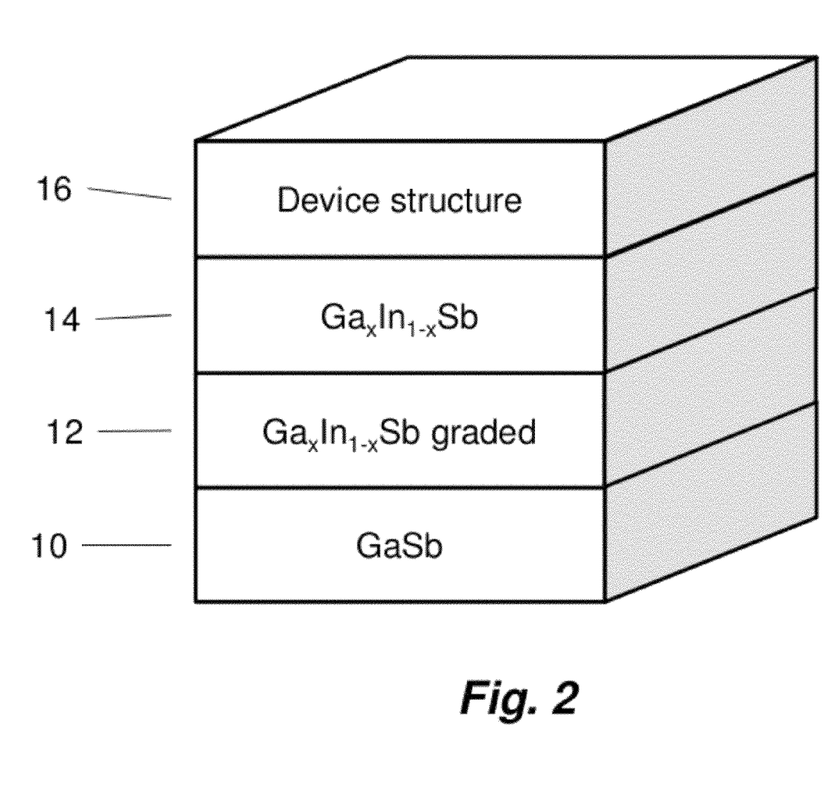
FIG. 2 depicts the layer structure of the semiconductor device grown on a lattice-matched substrate, according to one of the embodiments.

FIG. 2 illustrates one of the semiconductor device structures according to the present invention. The device structure is optimized for the active layer having the lattice constant between approximately 6.1 and 6.3 Angstrom. According to the teaching of the present invention, this can be achieved by obtaining, for example, bulk GaSb substrate 10 (commercially available in qualities suitable for the epitaxial growth); growing on its surface by means of MBE or MOVPE the graded transitional layer 12 of AlGaIn(As)Sb compound with In to Ga compositional ratio varying from zero to certain predetermined non-zero value corresponding to the lattice matching, with the active region of the semiconductor device; growing on top of the said transitional layer by means of MBE or MOVPE a(n) virtual substrate layer 14 with fixed composition, lattice-matched to the active region of the semiconductor device; and finally growing the layers 16 comprised in the active region of the semiconductor device.

Figure 3:
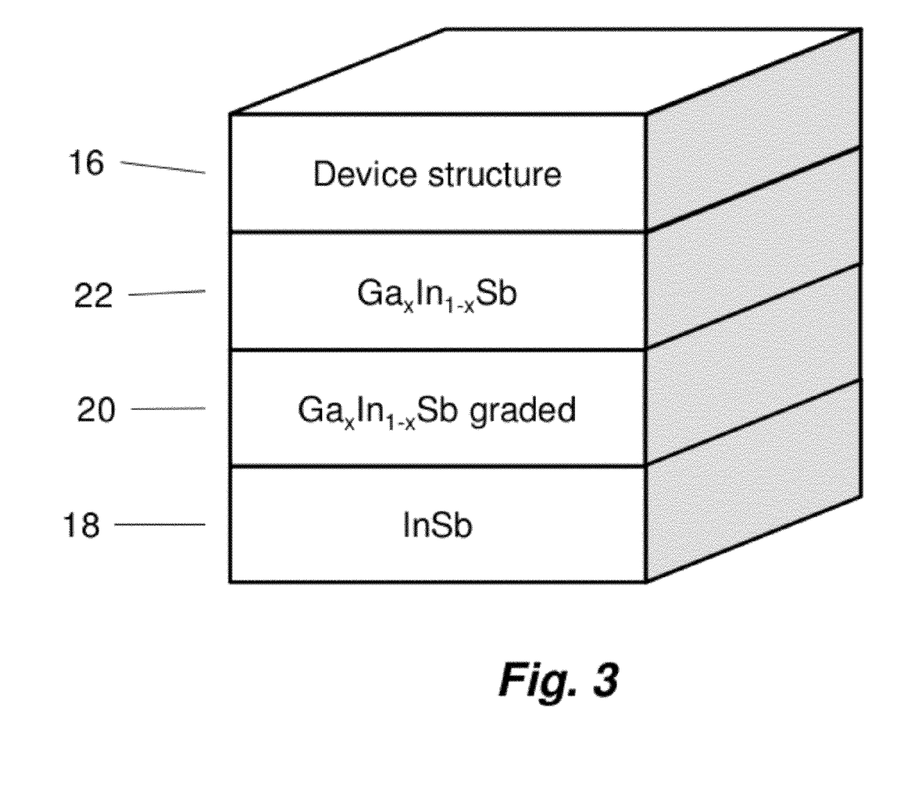
FIG. 3 depicts the layer structure of the semiconductor device grown on a lattice-matched substrate, according to yet another embodiment.

FIG. 3 illustrates one of the semiconductor device structures according to the present invention. The device structure is optimized for an active layer baying a lattice constant between approximately 6.3 and 6.5 Angstrom. According to the teaching of the present invention, this can be achieved by obtaining, for example, bulk InSb substrate 18 (commercially available in qualities suitable for the epitaxial growth); growing on its surface by means of MBE or MOVPE the graded transitional layer 20 of AlGaIn(As)Sb compound with Ga to In compositional ratio varying from zero to certain predetermined non-zero value corresponding to the lattice matching with the active region of the semiconductor device; growing on top of the said transitional layer by means of MBE or MOVPE a(n) virtual substrate layer 22 with fixed composition, lattice-matched to the active region of the semiconductor device; and finally growing the layers 16 comprised in the active region of the semiconductor device.

Figure 4:
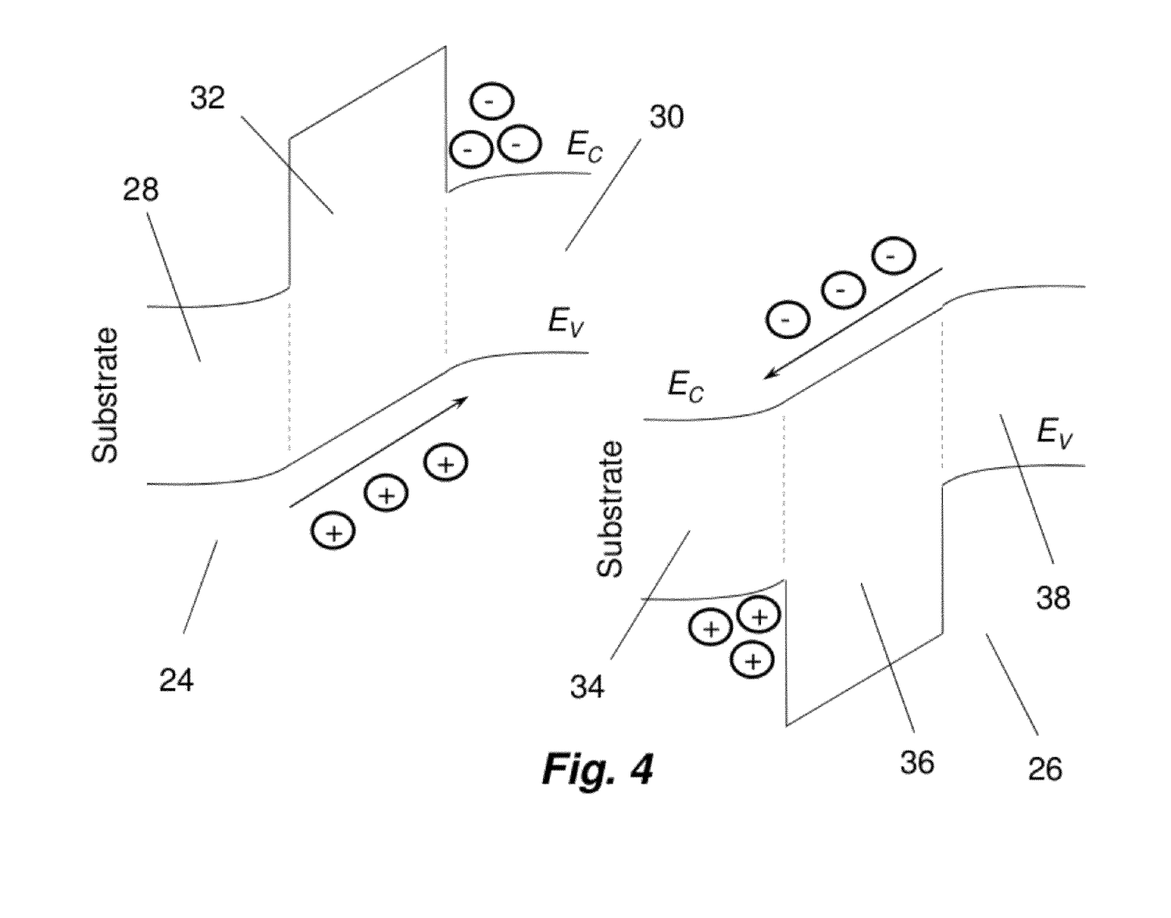
FIG. 4 presents typical band diagram of the nBn and pBp diode.

The band diagram of typical nBn barrier diode 24 and pBp diode 26 are schematically shown in FIG. 4. The nBn barrier diode 24 grown on the substrate comprises the n-type absorption layer 28 of a narrow band gap, the n-type contact layer 30 of a narrow band gap, and the undoped barrier layer 32 of wider band gap sandwiched between the first two. The band offsets between narrow band gap layers 28, 30 and wide band gap barrier 32 are designed in such a way that the said offset for the valence band is (much) smaller than the said offset for the conduction band. This fact is illustrated in FIG. 4 by diminishing the valence band offsets completely; it is understood however that some residual offset, either positive or negative, may still present in the structure.

The pBp barrier diode 26 grown on the substrate, as shown in the same FIG. 4, comprises the p-type absorption layer 34 of a narrow band gap, the p-type contact layer 36 of a narrow band gap, and the undoped barrier layer 38 of wider band gap sandwiched between the first two. The band offsets between narrow band gap layers 34, 36 and wide band gap barrier 38 are designed in such a way that the said offset for the conduction band is (much) smaller than the said offset for the valence band. This fact is illustrated in FIG. 4 by diminishing the conductance band offsets completely; it is understood however that some residual offset, either positive or negative, may still present in the structure.

Some other aspects of the present invention will be more clearly understood with the help of the fabrication procedure and characterization results of a practical semiconductor layers described below. It is noted that the example provided is for illustrative purposes only and is not intended to limit the scope of the present invention. In particular, the whole structure described below is fabricated without comprising an element Arsenic; although this fact is definitely an advantage significantly simplifying the epitaxial growth of the buffer, substrate and active layers of the structure, the invention is not suggesting or proposing to limit the materials available for the virtual substrate preparation to not comprising Arsenic.

PRACTICAL EXAMPLE

As an example of the present invention application to the practical semiconductor device, the structure, fabrication procedure and characterization results of the ternary compound layer effectively absorbing infrared radiation of the wavelength of 2.2 micrometers and shorter is disclosed below. It is understood that this practical disclosure is only illustrative to the teachings of the present invention and under no circumstances can limit the scope of the said present invention.

Epitaxial growth was performed on Te-doped (001) GaSb substrates in a Veeco GEN-930 solid-source MBE system equipped with an antimony valved cracker source. The substrate temperature was controlled by BandIT (K-space) in pyrometer mode. The growth rate of 1.0 ML/s was constant throughout the entire growth. After the standard procedure of the thermal surface oxide removal, the reflected high energy electron diffraction (RHEED) pattern indicated a clear (1×3) reconstructed surface with strong Kikuchi lines. A 500-nm GaSb buffer layer was grown at 530° C.

The virtual substrates with a lattice constant 0.9% larger than that of GaSb were grown on top of 2-μm-thick GaInSb transitional layers. The said transitional layers had a linearly graded indium composition, hence a linearly graded native lattice constant. The graded buffer is expected to relax part of the mismatch strain and confine the resulting dislocations. In order to reduce the amount of dislocation threading through the metamorphic layer, we chose a modest compositional grading rate of about 10% of indium per 1 μm, i.e., a mismatch grading rate of about 0.6% per μm. The graded buffer growth temperature was chosen to be rather high −540° C., which is known to provide better crystal quality.

During the growth of the graded buffer layer, the Ga and In fluxes were changed to provide the linear increase of In composition up to 20%. The constant composition 500-nm-thick $Ga_{0.84}In_{0.16}Sb$ virtual substrate layer was grown on top of a 2-μm graded buffer layer. The In composition of the virtual substrate was selected to lattice match the virtual substrate to the in-plane lattice constant of the slightly compressively strained topmost part of the graded buffer.

Figure 5:
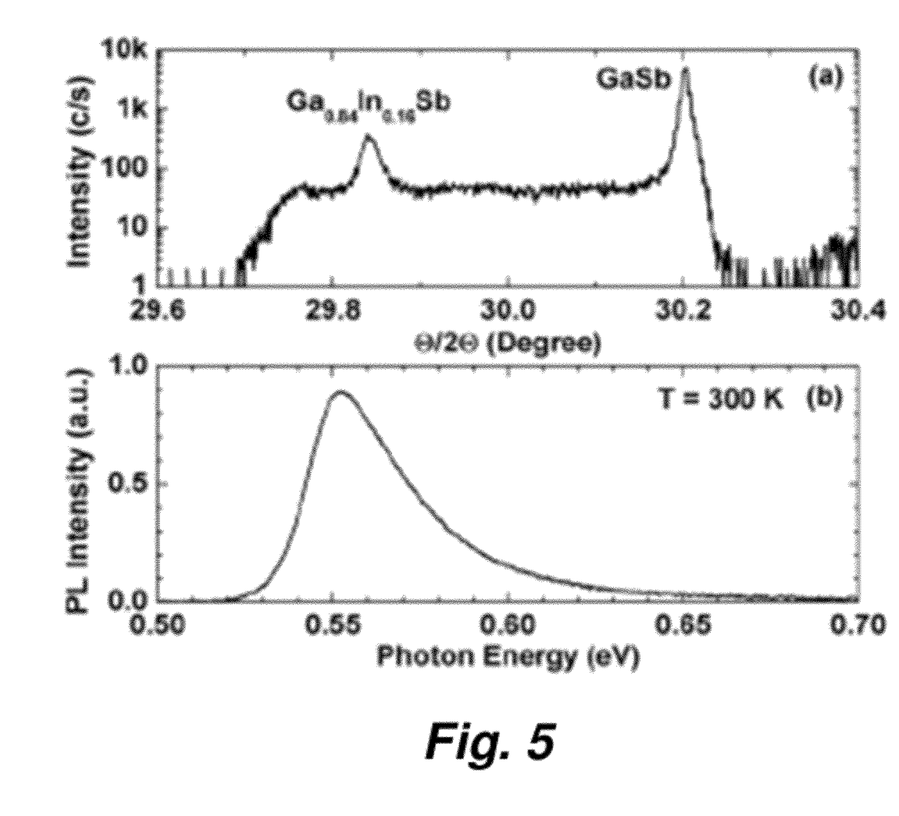
FIG. 5 shows experimental high-resolution x-ray diffraction and photoluminescence measurement results of one of the exemplary structures according to one of the embodiments.

FIG. 5 (top) shows the (004) θ/2-θ scan for the virtual substrate grown on the graded buffer. The rightmost intensive peak corresponds to the GaSb substrate. The flat shoulder to the left of the substrate peak corresponds to the graded buffer, since its vertical lattice constant increases continuously from that of GaSb to the value for the residually compressively strained GaInSb topmost layer. The amount of residual strain in the topmost part of the substrate layer is estimated to be about 0.2%. The reflex from the 500-nm-thick unstrained $Ga_{0.84}In_{0.16}Sb$ virtual substrate layer is clearly seen.

Intensive photoluminescence (PL) shown in FIG. 5 (bottom) was observed at room temperature from the test structure grown directly on top of the virtual substrate. The test structure consisted of two 10-nm-wide compressively strained $Ga_{0.65}In_{0.35}Sb$ QWs separated by 50 nm of $Al_{0.25}Ga_{0.64}In_{0.11}Sb$ alloy. The double-QW region was sandwiched between 400-nm layers of $Al_{0.25}Ga_{0.64}In_{0.11}Sb$. AlSb layers (20 nm) were added on both sides to achieve carrier confinement and the whole structure was capped by 20 nm of GaSb to prevent oxidation.

Figure 6:
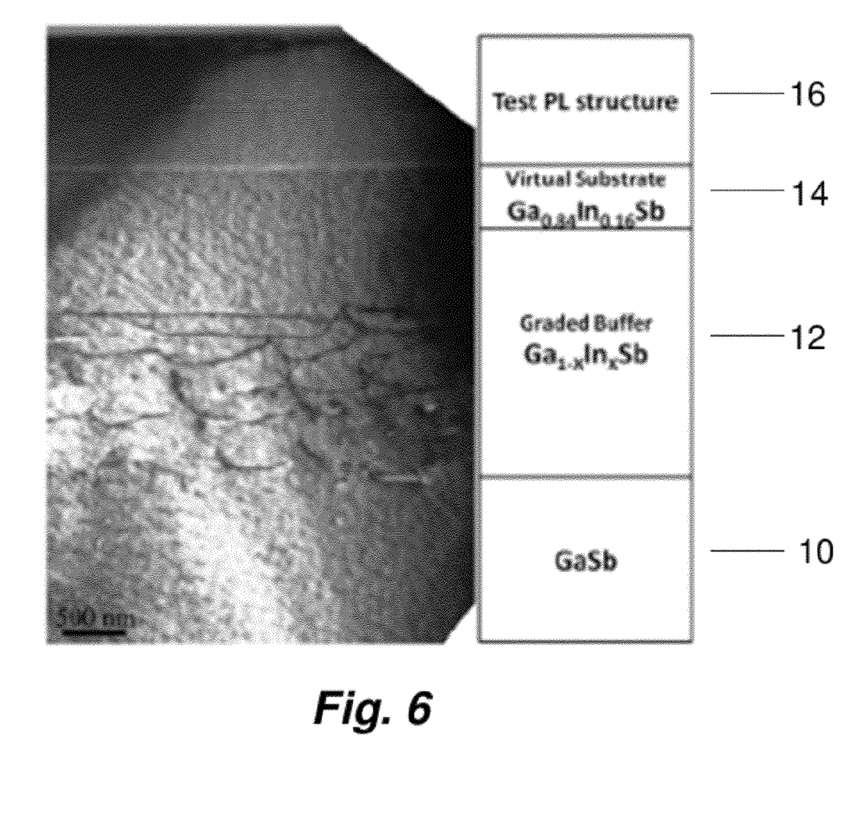
FIG. 6 provides the Transmission Electron Microscopy (TEM) image of one of the exemplary structures according to one of the embodiments.

FIG. 6 shows a cross-sectional transmission electron microscopy (X-TEM) micrograph of the test structure grown on the virtual substrate 14. No threading dislocations could be detected in the upper part of the graded buffer 12, the virtual substrate 14, or the test structure 16. The misfit dislocation network is fully confined in the bottom 1500 nm of the graded buffer layer 12. Long (μm scale) edge dislocation lines seen in the topmost part of the strained relaxed section of the buffer imply that threading dislocation glide in the residually strained region was effective.

What is claimed is:

1. A semiconductor device comprising:
   (a) a bulk single crystal substrate;
   (b) an active region comprising at least one layer of InAsSb material;
   (c) a buffer layer sandwiched between the said substrate and the said active region, further comprising:
      i. a transitional layer with graded composition, and
      ii. an unstrained, un-relaxed layer of GaInSb material of a fixed composition with lattice constant between 6.1 and 6.5 Angstrom immediately adjacent to the said active region;
   whereas the said active region is lattice matched to the said layer of GaInSb material.

2. A semiconductor device of claim 1, a semiconductor device being a photodetector comprising the barrier diode structure selected from the group of nBn and pBp barrier diode structures.

3. A semiconductor device of claim 2 operating in the spectral range of the electromagnetic radiation having a wavelength in vacuum between 2.6 and 16 micrometers, preferably between 4.2 and 16 micrometers.

4. A semiconductor device of claim 3 where the composition and thickness of the said layer of InAsSb material is selected to effectively absorb the electromagnetic radiation having the wavelength within the said spectral range.

5. A semiconductor device of any of the claims 1-4 where the said transitional layer comprised in the said buffer layer is continuously graded to provide the in-plane lattice constant transition from the lattice constant of the said substrate to the lattice constant matching that of the said GaInSb layer.

6. A semiconductor device comprising:
   (a) a bulk single crystal substrate;
   (b) an active region comprising at least one layer of InAsSb material;
   (c) a buffer layer sandwiched between the said substrate and the said active region, further comprising:
      i. a transitional layer with graded composition, and
      ii. an strained, un-relaxed layer of AlGaInSb material of a fixed composition with lattice constant between 6.1 and 6.5 Angstrom immediately adjacent to the said active region;
   whereas the said active region is lattice matched to the said layer of AlGaInSb material.

7. A semiconductor device of claim 6, a semiconductor device being a photodetector comprising the bather diode structure selected from the group of nBn and pBp barrier diode structures.

8. A semiconductor device of claim 7 operating in the spectral range of the electromagnetic radiation having a wavelength in vacuum between 2.6 and 16 micrometers, preferably between 4.2 and 16 micrometers.

9. A semiconductor device of claim 8 where the composition and thickness of the said layer of InAsSb material is selected to effectively absorb the electromagnetic radiation having the wavelength within the said spectral range.

10. A semiconductor device of any of the claims 6-9 where the said transitional layer comprised in the said buffer layer is continuously graded to provide the in-plane lattice constant transition from the lattice constant of the said substrate to the lattice constant matching that of the said AlGaInSb layer.

* * * * *